Figure 1:
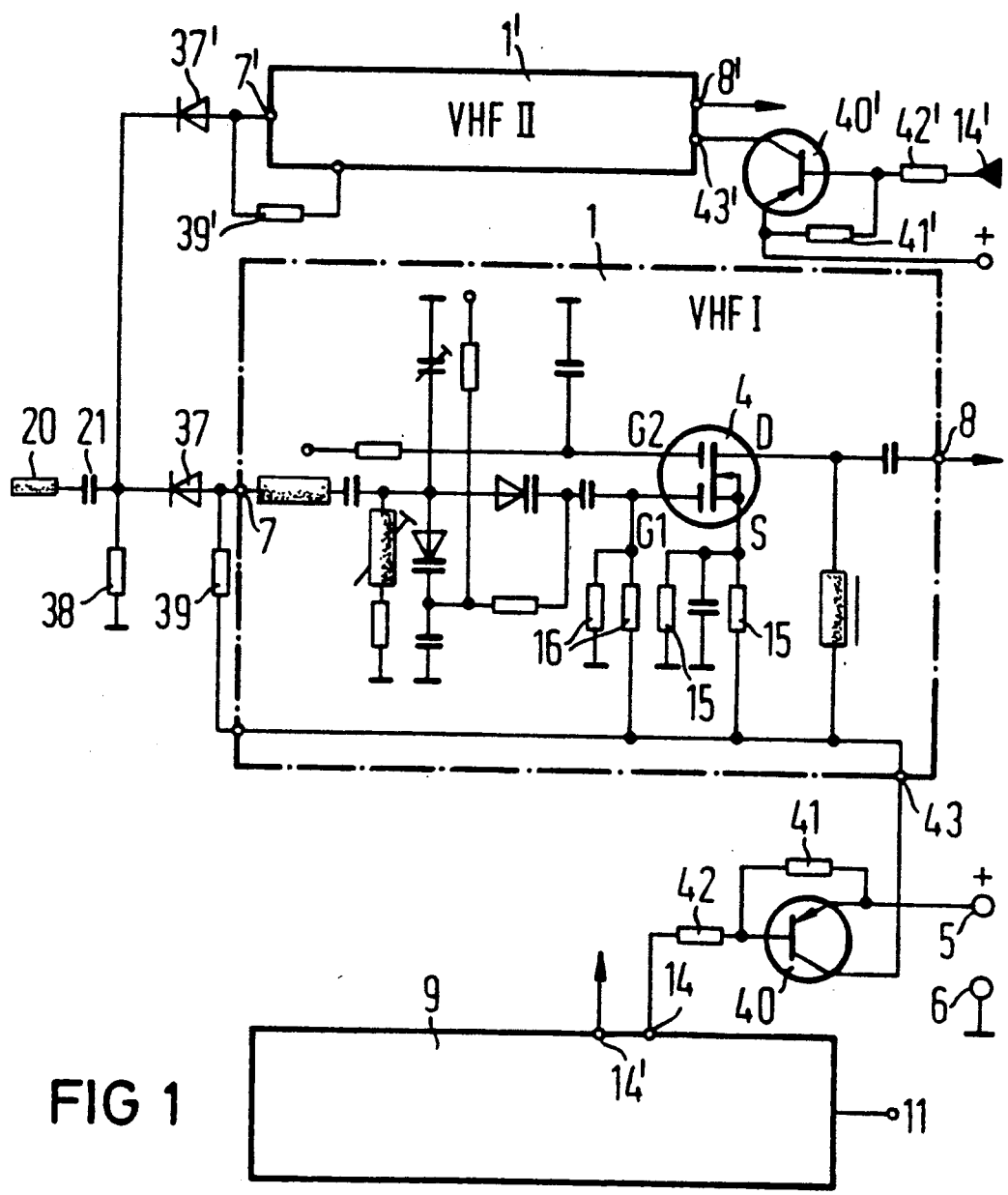

United States Patent [19]
Hohmann

[11] Patent Number: 5,214,399
[45] Date of Patent: May 25, 1993

[54] CIRCUIT CONFIGURATION FOR RANGE CHANGING IN TUNERS

[75] Inventor: Henning Hohmann, München, Fed. Rep. of Germany

[73] Assignee: Siemens Aktiengesellschaft, Munich, Fed. Rep. of Germany

[21] Appl. No.: 703,204

[22] Filed: May 20, 1991

[30] Foreign Application Priority Data

May 21, 1990 [EP] European Pat. Off. ............... 109586

[51] Int. Cl.$^5$ ............................................. H03J 5/24
[52] U.S. Cl. ............................................. 334/1; 334/15; 334/47; 455/188.2; 455/190.1
[58] Field of Search ............... 334/1, 15, 47, 52, 55; 455/188, 191, 195, 189, 190

[56] References Cited

U.S. PATENT DOCUMENTS

| | | | |
|---|---|---|---|
| 4,442,548 | 4/1984 | Lehmann | 455/195 |
| 4,590,612 | 5/1986 | Ijichi | 334/1 X |
| 4,823,099 | 4/1989 | Leipert | 334/15 |
| 4,851,796 | 7/1989 | Hendriks | 334/47 X |

FOREIGN PATENT DOCUMENTS 0299578 1/1989 European Pat. Off. .

OTHER PUBLICATIONS

"ICs für die Unterhaltungselektronik" 1986, Siemens Datenbuch: pp. 767-768.

Primary Examiner—Paul Gensler
Attorney, Agent, or Firm—Herbert L. Lerner; Laurence A. Greenberg

[57] ABSTRACT

A circuit configuration, especially in a television set, for range switching in tuners having at least two ranges includes at least two preselector stages each being assigned a respective tuner range. Each of the preselector stages is connected between a supply potential terminal and a reference potential terminal. Each of the preselector stages has an input terminal, an output terminal and an MOS tetrode. A switchgear for activating each of the MOS tetrodes has a switch output terminal being connected to the preselector stages and being connectable to the reference potential terminal. The preselector stages are coupled to one another for activating one of the preselector stages as a function of a switch state of the switch output terminal.

14 Claims, 3 Drawing Sheets

CIRCUIT CONFIGURATION FOR RANGE CHANGING IN TUNERS

The invention relates to a circuit configuration for range switching in tuners having at least two ranges, including one preselector stage for each range, each preselector stage having an MOS tetrode and being connected between a supply potential terminal and a reference potential terminal, the preselector stages having an input terminal and an output terminal, and each of the MOS tetrodes being activatable through a switchgear.

Television tuners typically include two or three sub-tuners, operated largely electrically independently of one another and covering the television frequency ranges in the VHF bands and in the UHF band.

In the case of the two or three VHF ranges, conventional tuners use shared oscillator circuits having partial inductances which are switched over with direct voltage controlled switch diodes for changing ranges.

Switching between the VHF and UHF ranges is carried out by means of pnp switch transistors. The emitters of the switch transistors are connected to the supply voltage terminal and the collectors thereof are connected to the subtuner. The base terminals are connected to circuit outputs of an integrated circuit, which is generally a PLL circuit. Such circuit outputs are current-limited open collector outputs, which develop low impedance and supply the subtuner with voltage through the corresponding switch transistor, when a range is selected by the control elements of the TV. An internal current limitation in the integrated circuit prevents an overly high base current of the switch transistor. The switchover among the VHF ranges is effected due to the fact that the switch transistor triggered by the integrated circuit brings the necessary currents for activating the switch diodes to bear.

Hyperband tuners, in other words tuners that cover the hyperband, which is also distributed in cable systems, in the frequency range from 300 to 470 MHz, as a rule include three electrically independent subtuners. As a rule, band or range changing of th tuned oscillator circuits is not carried out with switch diodes, because of the wide frequency ranges to be tuned. In contrast, switch diodes that switch only the range just selected to the antenna connection of the TV set, are used directly at the antenna input. Switchover of the subtuners and switch diodes is effected by means of switch transistors, as described above.

In many tuners, an integrated circuit which is currently used contains one mixer and one oscillator for the VHF range and for the UHF range. Also integrated into this integrated circuit is a switchgear that turns on the desired mixer and oscillator, by application of a predetermined control signal, such as voltage levels. For instance, the control signal may be derived through suitably constructed voltage dividers, from switched-over operating voltages for the subtuners. In that case, the switch transistors only switch the current of the switch diodes and the operating voltage of the preselector stages of the tuner, in which MOS tetrodes are typically used to amplify the high frequency. Two circuit configurations for range switching in television tuners with MOS tetrodes and an integrated circuit for VHF/UHF switchover are described, for instance, on pages 767 and 768 of the 1986/87 Siemens Data Book, entitled "ICs für die Unterhaltungselektronik" [ICs for Consumer Electronics].

A tuner from the firm Philips which is designated as UV 816 and does not need any switch transistors, is also known. That feature is achieved by mean of an integrated switchgear with non-current-limited switch outputs, by way of which the first gate terminals of the MOS tetrodes that are not to be turned on are applied to reference potential. That makes the MOS tetrodes currentless so that they lose their amplification. Only the MOS tetrode of the active range remains on, due to the fact that the switch output of the integrated switchgear, that is intended for such a purpose, continues to have high impedance and thus remains inactive. A disadvantage of such a principle is the following:

Such a tuner requires a control device, such as a microprocessor of the TV set for its control, with different software from the above-described tuners that have previously been used, since on one hand different switch outputs of the integrated switchgear are necessary and on the other hand, a switch logic with opposite polarity from its own must be used. Thus such a tuner is incompatible with previously known tuners.

The switch outputs of the integrated circuit that are used by such tuners cannot additionally be used for switching tasks outside the tuner, because it is not in accord with the conventional standard at present.

Furthermore, the known circuit configuration can only be used at no additional expense for tuners of the kind that have three subtuners as well as three preselector stages.

It is accordingly an object of the invention to provide a circuit configuration for range changing or switching in tuners having two preselector stages, which overcomes the hereinafore-mentioned disadvantages of the heretofore-known devices of this general type, which is compatible both in function and in software with earlier tuners, and in which the expense for circuitry and required space is reduced over previously known circuits.

With the foregoing and other objects in view there is provided, in accordance with the invention, a circuit configuration, such as in a TV set, for range switching in tuners having at least two ranges, comprising at least two preselector stages each being assigned a respective tuner range, each of the preselector stages being connected between a supply potential terminal and a reference potential terminal, each of the preselector stages having an input terminal, an output terminal and an MOS tetrode; and a switchgear for activating each of the MOS tetrodes, the switchgear having a switch output terminal being connected to the preselector stages and connectable to the reference potential terminal, the two preselector stages being coupled to one another for activating only one of the preselector stages at a time as a function of a switch state of the switch output terminal.

In accordance with another feature of the invention, the MOS tetrodes have first and second gate terminals and a source terminal, and there is provided a first resistor connected between the first gate terminal of the MOS tetrode of one of the preselector stages and the switch output terminal, and a second resistor connected between the source terminal of the MOS tetrode of another of the preselector stages and the switch output terminal.

In accordance with a further feature of the invention, the one preselector stage has a first voltage divider connected between the supply potential terminal and the reference potential terminal with a connecting point connected to the source terminal of the MOS tetrode of the one preselector stage, and a second voltage divider including the first resistor being connected between the switch output terminal and the reference potential terminal with a connecting point connected the first gate terminal of the MOS tetrode of the one preselector stage.

In accordance with an added feature of the invention, the other preselector stage has a first voltage divider connected between the supply potential terminal and the reference potential terminal with a connecting point connected to the source terminal of the MOS tetrode of the other preselector stage, and a second voltage divider connected between the supply potential terminal and the reference potential terminal with a connecting point connected to the first gate terminal of the MOS tetrode of the other preselector stage.

In accordance with an additional feature of the invention, the first and second voltage dividers in the other preselector stage are adjusted to attain a negative voltage at the source terminal of the MOS tetrode of the other preselector stage being high enough to pinch or cut-off a channel forming the MOS tetrode of the other preselector stage and remaining below a response threshold of protective diodes connected to the first and second gate terminals of the MOS tetrode of the other preselector stage.

In accordance with yet another feature of the invention, there is provided a switch diode having an anode and a cathode, the cathode of the switch diode being connected to the input terminal of one of the preselector stages, a terminal for an HF signal, at least one coupling element connected between the anode of the switch diode and the terminal, a resistor having a high resistance in comparison with the input impedance of the one preselector stage, the resistor being connected between the cathode of the switch diode and the switch output terminal, and a third voltage divider connected between the supply potential terminal and the reference potential terminal with a connecting point connected to the anode of the switch diode.

In accordance with yet a further feature of the invention, there is provided a switch diode having an anode and a cathode, the anode of the switch diode being connected to the input terminal of the first preselector stage, a terminal, at least one coupling element being connected the between the cathode of the switch diode and the terminal, a resistor having a high resistance in comparison with the input impedance of the one preselector stage, the resistor being connected between the anode of the switch diode and the signal output terminal, and a third voltage divider having a connecting point connected to the cathode of the switch diode.

In accordance with yet an added feature of the invention, there is provided an HF tuned circuit, the switchgear having a further switch output for switching the HF tuned circuit between a low-frequency range and a high frequency range.

In accordance with yet an additional feature of the invention, the HF tuned circuit includes a capacitor diode having an anode and a cathode, the anode of the capacitor diode being connected to the reference potential terminal; a series circuit connected to the cathode of the capacitor diode, the series circuit including a first capacitor, a first coil, a second coil and a second capacitor connected to the reference potential terminal, the first and second coils having a connecting point therebetween, the second coil and the second capacitor having a connecting point therebetween; a terminal, a resistor connected between the terminal and the cathode of the capacitor diode for delivering a tuning voltage; a fourth voltage divider connected between the reference potential terminal and the supply potential terminal with a connecting point connected to the connecting point between the second capacitor and the second coil; a further switch diode having an anode and a cathode, the anode of the further switch diode being connected to the connecting point between the first and second coils, a capacitor connected between the cathode of the further switch diode and the reference potential terminal, a fifth voltage divider connected between the cathode of the further switch diode and the supply potential terminal; and the fifth voltage divider having a connecting point connected to the further switch output of the switchgear.

In accordance with yet an additional feature of the invention, there is provided a mixing stage and/or an oscillator device of the tuner being connected to one of the switch outputs of the switchgear.

In accordance with a concomitant feature of the invention, the HF tuned circuit is a VHF tuned circuit.

Other features which are considered as characteristic for the invention are set forth in the appended claims.

Although the invention is illustrated and described herein as embodied in a circuit configuration for range changing in tuners, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
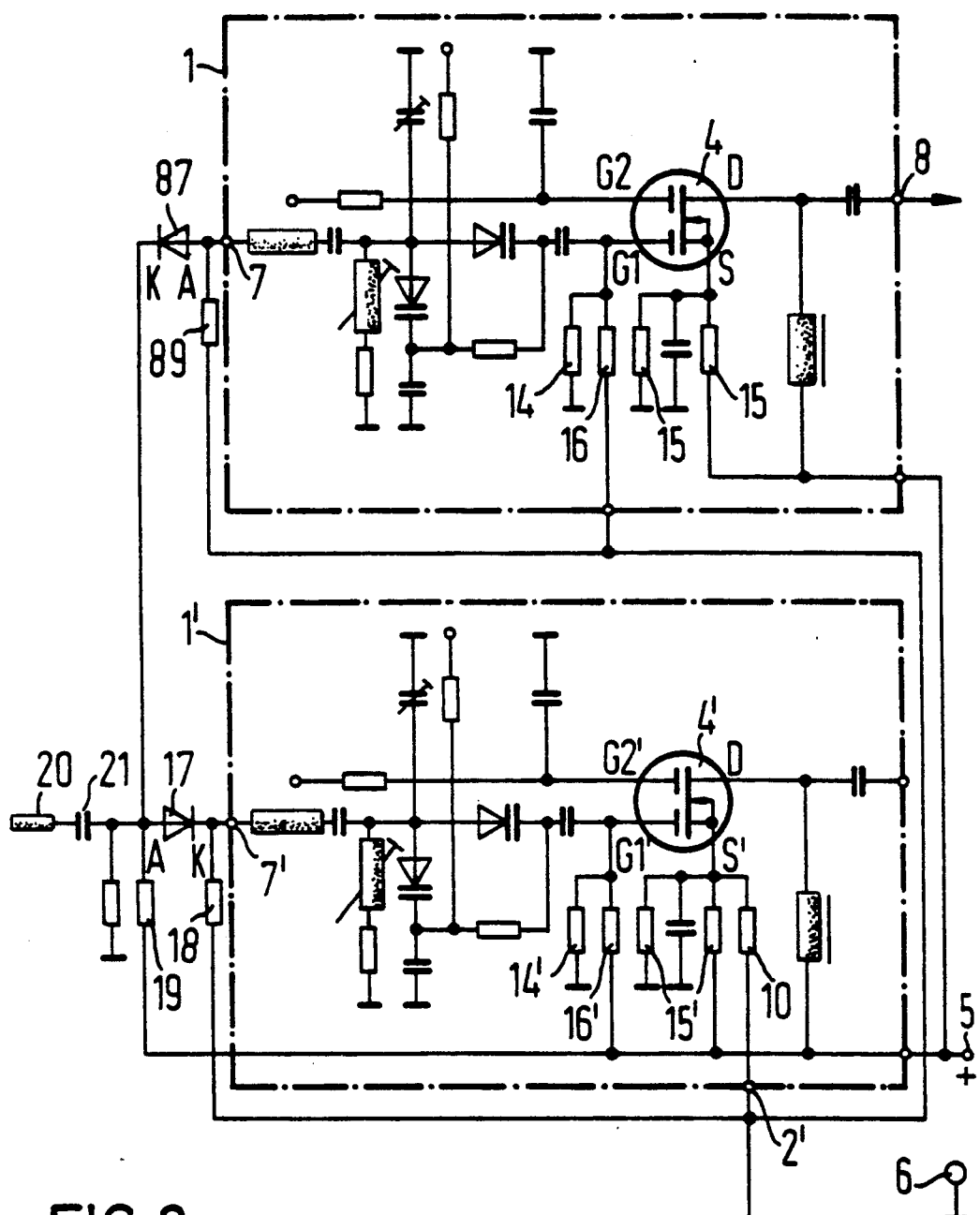
Figure 2:
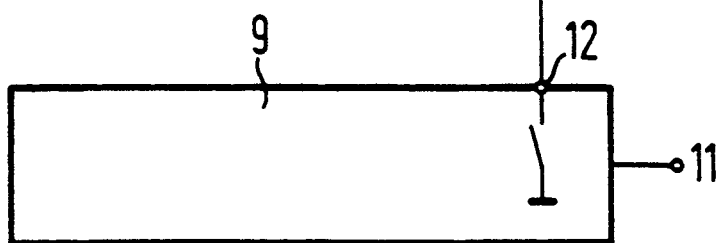
Figure 3:
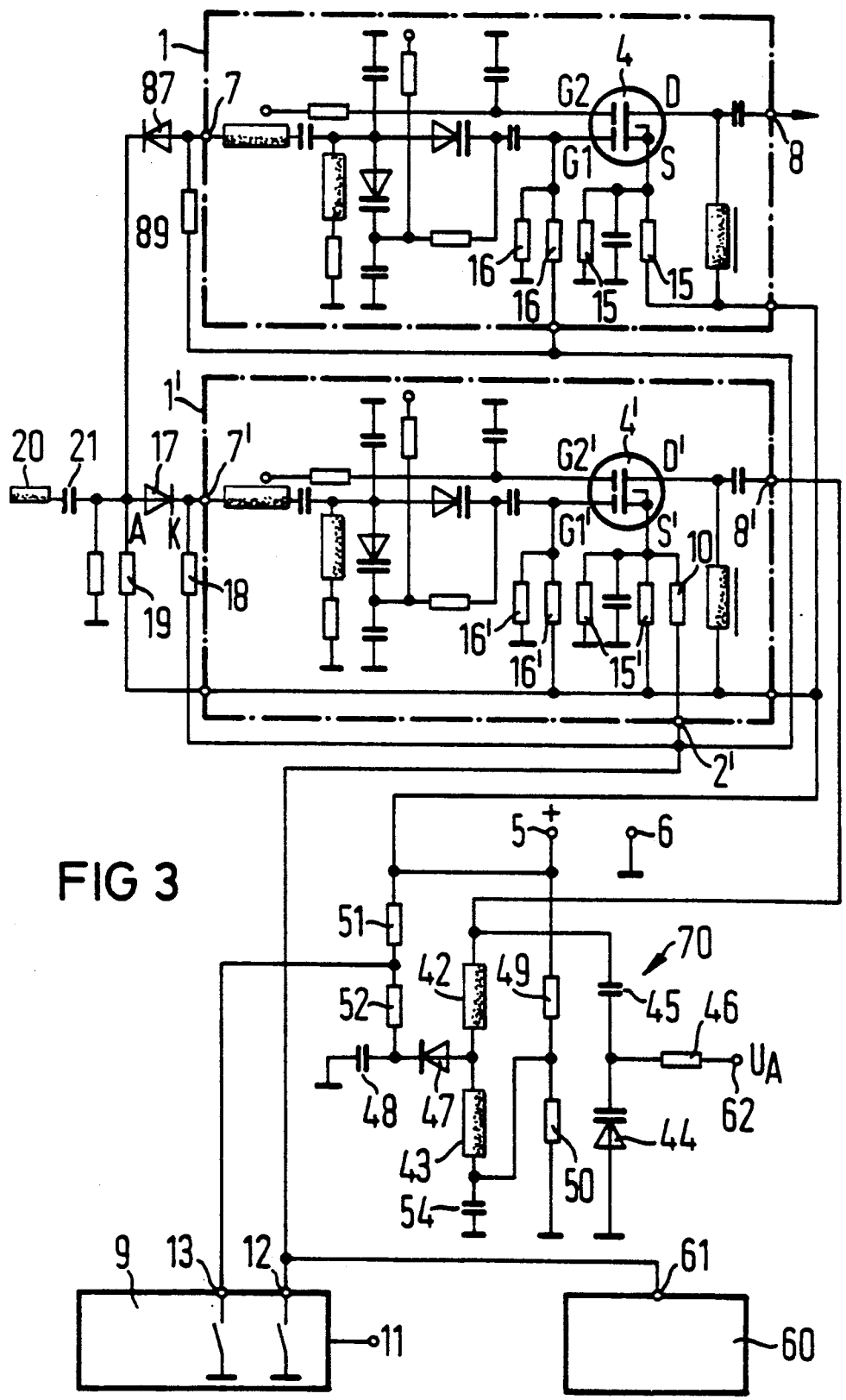

FIG. 1 is a schematic and block circuit diagram of a known circuit configuration for range switching in tuners having two ranges;

FIG. 2 is a diagram of an example of a circuit configuration according to the invention for range switching in tuners with two ranges, in which preselector stages of the ranges are coupled in the manner of an OR function of their switch states and are activatable through a switch output of a switchgear; and FIG. 3 is a diagram of a further development of the circuit configuration of FIG. 2 for switchover of an HF tuned circuit from a low-frequency range to a higher-frequency range, using a further circuit output of the switchgear.

The invention is described below in conjunction with the drawings in terms of an example of range switching from the VHF range to the UHF range.

Referring now to the figures of the drawing in detail and first, particularly, to FIG. 1 thereof, there is seen an input stage of a known television tuner. The input stage has two preselector stages 1, 1' with MOS tetrodes 4 for amplifying an antenna signal to be applied to a terminal 20. Each of the preselector stages 1, 1' is dimensioned for a given frequency range. The antenna signal reaches the cathodes of two switch diodes 37, 37' through a coupling capacitor 21. The anodes of the two switch diodes 37, 37' are each connected to a respective input terminal 7, 7' of the preselector stages 1, 1'. One high-frequency-amplified signal for each range can be picked up from the applicable preselector stages 1, 1' at output terminals 8, 8'. For the sake of simplicity, only the preselector stage 1 for a first range, in this case the VHF range, is shown in detailed form with its individual circuit components as an example. This is also known from the aforementioned Siemen's data book 1986/1987. The circuit configuration will therefore only be discussed below to the extent necessary for comprehension of the invention.

The MOS tetrode 4 has a source terminal S which is connected to a connecting point of a first voltage divider 15, and a first gate terminal G1 which is connected to a connecting point of a second voltage divider 16, for setting an operating point. Both voltage dividers 15 and 16 are located between a reference potential terminal 6 and a terminal 43, which is switchable through a pnp switch transistor 40 to a supply potential terminal 5 to which positive voltage is applied. To this end, the collector terminal of this pnp switch transistor 40 is connected to the terminal 43, and its base terminal is connected through a base resistor 42 to a switch output 14 of a switchgear 9. On one hand, the emitter terminal of the pnp switch transistor 40 is connected through an emitter resistor 41 to the base terminal of the pnp switch transistor 40, and on the other hand the emitter terminal is directly connected to the supply potential terminal 5. The switch output 14 of the switchgear 9 is controlled by means of one or more control signals, through one or more control terminals 11. Additionally, the anode of the switch diode 37 is connected to the terminal 43 of the preselector stage 1 through a resistor 39.

If, by specification of the control signal or signals applied to the control terminal or terminals 11, the switch output 14 of the switchgear 9 is switched to low impedance or in other words to reference potential upon selection of the VHF range by means of control elements of the TV set, then the pnp switch transistor 40 turns on. The positive voltage at the supply potential terminal 5 thus reaches the terminal 43, causing the preselector stage 1 to be connected to positive voltage and thus activated. At the same time the switch diode 37 becomes conducting, because its cathode is then more negative than its anode. The current for switching this switch diode 37 is furnished by the pnp switch transistor 40. The antenna signal applied to the terminal 20, which is to be amplified, is thus amplified in the preselector stage 1 and is available at the output terminal 8.

The switchover to the other range, in this case to the preselector stage 1' for the UHF range, is effected analogously through a switch output 14' of the switchgear 9 and additionally by means of the circuit components marked with reference numerals 7', 37', 40', 41', 42' and 43'. When the reference numerals are the same they represent analogous switch elements. In the case of a low-impedance switch output 14', the preselector stage 1' is switched through the pnp switch transistor 40' that is then turned on, to the supply potential terminal 5, and thus becomes active as an amplifier.

The switch outputs 14, 14' of the switchgear 9 are current-limited open collector outputs. A current limitation in the switchgear 9 prevents an overly high base current of the pnp switch transistors 40, 40'.

FIG. 2 shows an exemplary embodiment of a circuit configuration according to the invention for range switching in tuners with two ranges. Identical elements are again provided with the same reference numerals as in FIG. 1. A separate preselector stage 1, 1' is provided for each of the ranges, each having one MOS tetrode 4, 4' as the component serving the purpose of high frequency amplification. The preselector stages 1, 1' are essentially the same in structure as in FIG. 1.

However, the two preselector stages 1, 1' are coupled to one another in the manner of an OR function of their switch states. To this end, in the first preselector stage 1, a voltage divider including first and second resistors 14 and 16 has a connection point which is connected to a first gate terminal G1 of the MOS tetrode 4. The first resistor 14 is at reference potential, while the second resistor 16 is connected to a switch or signal output terminal 12 of a switchgear 9. As in FIG. 1, the voltage divider 15 which has a connecting point connected to the source terminal S, is located between the supply potential terminal 5 and the reference potential terminal 6.

The second preselector stage 1' again corresponds to the circuit of a preselector stage of FIG. 1. A first voltage divider 15', which is connected between the supply potential terminal 5 and the reference potential terminal 6, has a connecting point which is connected to a source terminal S', and a second voltage d'divider 14', 16' connected between the supply potential terminal 5 and the reference potential terminal 6, has a connecting point connected to a first gate terminal G1' of the MOS tetrode. In this preselector stage 1', the source terminal S' of the MOS tetrode 4' is additionally connected through a resistor 10 to the switch output 12 of the switchgear 9. This resistor 10, which is connected parallel to a resistor of the first voltage divider 15', is advantageously, dimensioned in such a way that the operating point of the MOS tetrode 4' that is intended for optimal amplification is established.

Furthermore, in the second preselector stage 1', the first voltage divider 15' and the second voltage divider 14', 16'are adjusted in such a way that a voltage is provided at the source terminal S', which is negative as compared with the first gate terminal G1', which on one hand is high enough to pinch or cut-off a channel forming in the MOS tetrode 4' and which on the other hand remains below the response threshold of protective diodes connected to the first gate terminal G1'and a second gate terminal G2' of the MOS tetrode 4'.

A circuit configuration according to the invention as shown in FIG. 2 assures that when the switch output 12 of the switch device 9 is inactive, or in other words has high impedance, the MOS tetrode 4' of the second preselector stage 1' is biased, through the first voltage divider 15' at the source terminal S' and through the second voltage divider 14', 16' at the first gate terminal G1', in such a manner that the channel of the MOS tetrode 4 is pinched off, thus making this tetrode currentless and turning it off. In contrast, the MOS tetrode 4 of the first preselector stage 1 receives such a potential at its first gate terminal G1 through the voltage divider 14, 16, and at its source terminal S through the voltage divider 15, that the current for full amplification is established in this preselector stage 1.

In contrast, if the switch output 12 of the switchgear 9 comes to have low impedance because of control signals applied to a signal input terminal 11, then the resistor 10 of the second preselector stage 1' is connected with the reference potential terminal 6. As a result, the operating point of the MOS tetrode 4' is adjusted in such a way that full amplification in the second preselector stage 1' is attained. Simultaneously, through the voltage divider of the first preselector stage 1 which includes the resistors 14 and 16, the potential at the first gate terminal G1 of the MOS tetrode 4 is connected to the reference potential terminal 6. The MOS tetrode 4 is thus blocked due to the biasing that persists at its source terminal S. The switchover of the two MOS tetrodes 4, 4' can accordingly be performed with only a single switch output 12 of the switchgear 9, and without additional external switch transistors.

It is advantageous but not compulsory for respective switch diodes 87 and 17 to be additionally connected to the input terminals 7 and 7' of the preselector stages 1 and 1'. The cathode of the switch diode 17 is connected to the input 7' of the second preselector stage 1' and is connected through a resistor 18 of high impedance as compared with the input impedance of the preselector stage 1', to the switch output 12 of the switchgear 9. A third voltage divider 19 is connected between the supply potential terminal 5 and the reference potential terminal 6, and has a connecting point connected to the anode of this switch diode 17.

In contrast, the anode of the switch diode 87 is connected to the input terminal 7 of the preselector stage 1 and the cathode thereof is connected to the anode of the switch diode 17. One terminal of a resistor 89 is additionally connected to the anode of the switch diode 87 and the other terminal of the resistor 89 is connected to the switch output 12 of the switchgear 9. This resistor 89 is selected to have high impedance in comparison with the input impedance of the preselector stage 1.

Due to this structure, as long as the switch output 12 is not connected to reference potential, the switch diode 17 will block, so that no antenna signal can reach the input terminal 7' of the preselector stage 1'. The switch diode 17 blocks the preselector stage 1', since its anode is more negative than its cathode, because of the third voltage divider 19. In contrast, the switch diode 87 is conducting. On the other hand, if the preselector stage 1' is to be activated and consequently the preselector stage 1 is to be turned off, then the MOS tetrode 4' of the preselector stage 1' must turn on, which is accomplished by applying the switch output 12 of the switchgear 9 to reference potential. The switch diode 17 then carries current, because its anode potential becomes more positive than its cathode potential. In contrast, the switch diode 87 blocks.

The connecting point between the two switch diodes 17 and 87 is connected to the terminal 20 for the high frequency input signal through the coupling element 21, such as the coupling capacitor known from FIG. 1.

A particularly suitable switchgear 9 is a integrated circuit in which the switch output 12 that is necessary for range switching does not need to have current limitation. It is particularly advantageous for the triggering of the switch output 12 to be constructed in such a way as to be compatible with the control software for previously known tuners. Moreover, the switchgear 9 can be included in an integrated PLL (phase-locked loop) circuit, which has the necessary stages for frequency adjustment and band switching.

It has been found that in the switchgear 9, a switch transistor for triggering the switch output 12 must be dimensioned in such a way that it can switch a current of approximately 25 mA, at a voltage strength of approximately 12 V.

A further development of the circuit configuration according to the invention is shown in FIG. 3. In addition to the switch output 12 provided for switching between the two preselector stages 1 and 1', the switchgear 9 in FIG. 3 has a further switch output 13, in order to switch an HF tuned circuit 70, for instance a VHF tuned circuit connected to an output terminal 8' of the second preselector stage 1', from a lower-frequency range to a higher-frequency range, and vice-versa.

To this end, this HF tuned circuit has the following characteristics:
- a capacitor diode 44 having an anode connected to the reference potential terminal 6;
- the capacitor diode 44 having a cathode connected to a series circuit of a first capacitor 45, a first coil 42, a second coil 43 as well as a second capacitor 54 connected to the reference potential terminal 6; 'a resistor 46 connected between a terminal 62 and the cathode of the capacitor diode 44, for delivering a tuning voltage $U_A$;
- a fourth voltage divider 49, 50, connected between the reference potential terminal 6 and the supply potential terminal 5, with a connecting point connected to the connecting point between the second capacitor 54 and the second coil 43;
- a further switch diode 47 having an anode connected to the connecting point between the first coil 42 and the second coil 43, and a cathode connected on one hand to a capacitor 48 connected to the reference potential terminal 6 and on the other to a fifth voltage divider 51, 52 connected to the supply potential terminal 5; and
- the fifth voltage divider 51, 52 having a connecting point connected to the further signal output 13 of the switchgear 9.

In this exemplary embodiment, the output terminal 8' of the second preselector stage communicates with the connecting point between the coil 42 and the capacitor 45.

Switching between the low-frequency range and the higher-frequency range of this HF tuned circuit 70 functions as follows: in the inactive state of the switch output 13, in other words when the switch output 13 has high impedance, the switch diode 47 is blocked because the cathode of the switch diode 47 is at a higher potential than its anode through the use of the high-impedance resistor 51. This is attained by means of the voltage divider having the resistors 49 and 50. Since the coils 42 and 43 are thus series-connected, the low-frequency range of the HF tuned circuit 70 is operative.

In the active state of the switch output 13, that is when the switch output 13 is connected to the reference potential terminal 6, a current that causes the switch diode 47 to have low impedance flows through this switch diode 47. The coil 43 is thus short-circuited, and the HF tuned circuit 70 is switched to its high-frequency range.

With this kind of circuit configuration, switching of the two ranges of the HF tuned circuit 70 can be carried out with only a single switch output 13 of the switchgear 9, without requiring external switch transistors.

It is also possible to connect a band switch input 61 of a mixer stage and/or oscillator circuit 60 to the switch outputs 12 or 13 of the switchgear 9, in order to trigger them.

I claim:

1. A circuit configuration for range switching in tuners having at least two ranges, comprising at least two preselector stages each being assigned a respective tuner range, each of said preselector stages being connected between a supply potential terminal and a reference potential terminal, each of said preselector stages having an input terminal, an output terminal and an MOS tetrode; and a switchgear for activating each of said MOS tetrodes, said switchgear having a switch output terminal commonly connected to all of said preselector stages and switchingly connectable to the reference potential terminal, said preselector stages being coupled to one another for activating one of said preselector stages as a function of a switch state of said switch output terminal.

2. The circuit configuration according to claim 1, wherein said MOS tetrodes have first and second gate terminals and a source terminal, and including a first resistor connected between the first gate terminal of said MOS tetrode of one of said preselector stages and said switch output terminal, and a second resistor connected between the source terminal of said MOS tetrode of another of said preselector stages and said switch output terminal.

3. The circuit configuration according to claim 2, wherein said one preselector stage has a first voltage divider connected between the supply potential terminal and the reference potential terminal with a connecting point connected to the source terminal of said MOS tetrode of said one preselector stage, and a second voltage divider including said first resistor being connected between said switch output terminal and the reference potential terminal with a connecting point connected the first gate terminal of said MOS tetrode of said one preselector stage.

4. The circuit configuration according to claim 3, wherein said other preselector stage has a first voltage divider connected between the supply potential terminal and the reference potential terminal with a connecting point connected to the source terminal of said MOS tetrode of said other preselector stage, and a second voltage divider connected between the supply potential terminal and the reference potential terminal with a connecting point connected to the first gate terminal of said MOS tetrode of said other preselector stage.

5. The circuit configuration according to claim 4, wherein said first and second voltage dividers in said other preselector stage provide a negative voltage at the source terminal of said MOS tetrode of said other preselector stage being high enough to pinch off a channel forming said MOS tetrode of said other preselector stage and remaining below a response threshold of protective diodes connected to the first and second gate terminals of said MOS tetrode of said other preselector stage.

6. The circuit configuration according to claim 1, including a switch diode having an anode and a cathode, the cathode of said switch diode being connected to the input terminal of one of said preselector stages, a terminal for an HF signal, at least one coupling element connected between the anode of said switch diode and said terminal, a resistor having a high resistance in comparison with the input impedance of said one preselector stage, said resistor being connected between the cathode of said switch diode and said switch output terminal, and a voltage divider connected between the supply potential terminal and the reference potential terminal with a connecting point connected to the anode of said switch diode.

7. The circuit configuration according to claim 1, including a switch diode having an anode and a cathode, the anode of said switch diode being connected to the input terminal of one of said preselector stages, a terminal for an HF signal, at least one coupling element being connected the between the cathode of said switch diode and said terminal, a resistor having a high resistance in comparison with the input impedance of said one preselector stage, said resistor being connected between the anode of said switch diode and said switch output terminal, and a voltage divider having a connecting point connected to the cathode of said switch diode.

8. The circuit configuration according to claim 1, including an HF tuned circuit, said switchgear having a further switch output for switching said HF tuned circuit between a low-frequency range and a high frequency range.

9. The circuit configuration according to claim 8, wherein said HF tuned circuit includes:
   a capacitor diode having an anode and a cathode, the anode of said capacitor diode being connected to the reference potential terminal;
   a series circuit connected to the cathode of said capacitor diode, said series circuit including a first capacitor, a first coil, a second coil and a second capacitor connected to the reference potential terminal, said first and second coils having a connecting point therebetween, said second coil and said second capacitor having a connecting point therebetween;
   a terminal, a resistor connected between said terminal and the cathode of said capacitor diode for delivering a tuning voltage;
   a voltage divider connected between the reference potential terminal and the supply potential terminal with a connecting point connected to the connecting point between said second capacitor and said second coil;
   a further switch diode having an anode and a cathode, the anode of said further switch diode being connected to the connecting point between said first and second coils, a capacitor connected between the cathode of said further switch diode and the reference potential terminal, another voltage divider connected between the cathode of said further switch diode and the supply potential terminal; and
   the other voltage divider having a connecting point connected to said further switch output of said switchgear.

10. The circuit configuration according to claim 9, including a mixing stage of the tuner being connected to one of said switch outputs o said switchgear.

11. The circuit configuration according to claim 9, including an oscillator device of the tuner being connected to one of said switch outputs of said switchgear.

12. The circuit configuration according to claim 9, including a mixing stage and an oscillator device of the tuner being connected to one of said switch outputs of said switchgear.

13. The circuit configuration according to claim 8, wherein said HF tuned circuit is a VHF tuned circuit.

14. A television set, comprising a circuit configuration for range switching in tuners having at least two ranges, said circuit configuration including at least two preselector stages each being assigned a respective tuner range, each of said preselector stages being connected between a supply potential terminal and a reference potential terminal, each of said preselector stages having an input terminal, an output terminal and an MOS tetrode; and a switchgear for activating each of said MOS tetrodes, said switchgear having a switch output terminal commonly connected to all of said preselector stages and switchingly connectable to the reference potential terminal, said preselector stages being coupled to one another for activating one of said preselector stages as a function of a switch state of said switch output terminal.

* * * * *

UNITED STATES PATENT AND TRADEMARK OFFICE
CERTIFICATE OF CORRECTION

PATENT NO. : 5,214,399
DATED : May 25, 1993
INVENTOR(S) : Henning Hohmann

It is certified that error appears in the above-indentified patent and that said Letters Patent is hereby corrected as shown below:

On the title page, item [30], change "109586" to --90109586--

Signed and Sealed this

Tenth Day of May, 1994

Attest:

BRUCE LEHMAN

Attesting Officer     Commissioner of Patents and Trademarks